US012677590B2

(12) United States Patent
Chen et al.

(10) Patent No.: US 12,677,590 B2
(45) Date of Patent: Jul. 7, 2026

(54) ORGANIC LIGHT-EMITTING DIODE AND DISPLAY PANEL

(71) Applicant: BOE TECHNOLOGY GROUP CO., LTD., Beijing (CN)

(72) Inventors: Lei Chen, Beijing (CN); Lixia Qiu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 944 days.

(21) Appl. No.: 17/432,161

(22) PCT Filed: Nov. 19, 2020

(86) PCT No.: PCT/CN2020/130004

§ 371 (c)(1),
(2) Date: Aug. 19, 2021

(87) PCT Pub. No.: WO2022/104627

PCT Pub. Date: May 27, 2022

(65) Prior Publication Data

US 2022/0367826 A1 Nov. 17, 2022

(51) Int. Cl.
*H10K 85/60* (2023.01)
*H10K 50/11* (2023.01)
(Continued)

(52) U.S. Cl.
CPC ........... *H10K 85/626* (2023.02); *H10K 50/11* (2023.02); *H10K 50/115* (2023.02); *H10K 50/16* (2023.02);
(Continued)

(58) Field of Classification Search
CPC ...... H10K 50/11; H10K 50/115; H10K 50/16; H10K 50/171; H10K 85/615;
(Continued)

(56) References Cited

U.S. PATENT DOCUMENTS

2004/0137270 A1* 7/2004 Seo ........................ H05B 33/14 428/690
2006/0273714 A1* 12/2006 Forrest ................... H10K 50/11 313/506
(Continued)

FOREIGN PATENT DOCUMENTS

CN 104576953 A 4/2015
CN 109503466 A 3/2019
(Continued)

OTHER PUBLICATIONS

English translation of KR 20180065246 A obtained from Google Patents (Year: 2018).*
(Continued)

*Primary Examiner* — Braelyn R Watson
(74) *Attorney, Agent, or Firm* — HOUTTEMAN LAW LLC

(57) ABSTRACT

The present disclosure provides an organic light-emitting diode and a display panel, the organic light-emitting diode including: a first electrode, a second electrode, a light-emitting layer, a hole blocking layer and an electron transport layer; the first electrode and the second electrode are oppositely arranged; the light-emitting layer is between the first electrode and the second electrode; the hole blocking layer is between the light-emitting layer and the second electrode; the electron transport layer is between the hole transport layer and the second electrode, wherein the energy level difference between the HOMO energy level of the hole blocking layer and the HOMO energy level of the light-emitting layer is larger than or equal to 0.1 eV, and the energy level difference between the HOMO energy level of the electron transport layer and the HOMO energy level of the hole blocking layer is larger than or equal to 0.1 eV.

10 Claims, 2 Drawing Sheets

(51) Int. Cl.

| | |
|---|---|
| ***H10K 50/115*** | (2023.01) |
| ***H10K 50/16*** | (2023.01) |
| ***H10K 50/17*** | (2023.01) |
| ***H10K 50/18*** | (2023.01) |
| ***H10K 101/40*** | (2023.01) |

(52) U.S. Cl.
CPC ......... *H10K 50/171* (2023.02); *H10K 85/615* (2023.02); *H10K 85/624* (2023.02); *H10K 85/631* (2023.02); *H10K 85/652* (2023.02); *H10K 85/654* (2023.02); *H10K 85/6565* (2023.02); *H10K 85/6574* (2023.02); *H10K 50/18* (2023.02); *H10K 2101/40* (2023.02)

(58) Field of Classification Search
CPC .. H10K 85/624; H10K 85/631; H10K 85/652; H10K 85/654; H10K 85/6565; H10K 85/6574; H10K 2101/40; H10K 50/18; H10K 85/633; H10K 85/657; H10K 85/626; H10K 85/6576; H01L 51/5004; H01L 51/0056; H01L 51/0073; H01L 51/0074; H01L 51/007
See application file for complete search history.

(56) References Cited

U.S. PATENT DOCUMENTS

| | | | | |
|---|---|---|---|---|
| 2009/0039294 | A1* | 2/2009 | Choong | H10K 50/125 250/493.1 |
| 2015/0060794 | A1* | 3/2015 | Oh | H10K 50/166 438/34 |
| 2016/0093812 | A1* | 3/2016 | Stoessel | H10K 85/654 438/46 |
| 2017/0062750 | A1* | 3/2017 | Jung | H10K 50/13 |
| 2018/0076391 | A1 | 3/2018 | Huang et al. | |
| 2020/0185633 | A1* | 6/2020 | Hong | H10K 50/11 |
| 2020/0235343 | A1* | 7/2020 | Shin | H10K 50/18 |
| 2021/0074918 | A1* | 3/2021 | Kim | H10K 85/654 |
| 2021/0143329 | A1* | 5/2021 | Yoon | H10K 50/11 |

FOREIGN PATENT DOCUMENTS

| | | | | |
|---|---|---|---|---|
| CN | 110128332 | A * | 8/2019 | C07D 401/12 |
| CN | 110234632 | A | 9/2019 | |
| CN | 110407829 | A | 11/2019 | |
| CN | 110615809 | A | 12/2019 | |
| CN | 110660924 | A * | 1/2020 | G09F 9/33 |
| CN | 111864095 | A | 10/2020 | |
| KR | 101536569 | B1 | 7/2015 | |
| KR | 20180065246 | A * | 6/2018 | |
| WO | WO-2015001726 | A1 * | 1/2015 | H01L 51/0059 |
| WO | WO-2019004796 | A1 * | 1/2019 | H10K 85/111 |
| WO | 2020194411 | A1 | 10/2020 | |

OTHER PUBLICATIONS

English translation of WO 2015001726 A1 obtained from Global Dossier (Year: 2015).*

English translation of CN 110128332 A obtained from Global Dossier (Year: 201).*

Huang, C. J., et al. "Improving the color purity and efficiency of blue organic light-emitting diodes (BOLED) by adding hole-blocking layer." Journal of Luminescence 129.11 (2009): 1292-1297. (Year: 2009).*

English translation of CN 110660924 A obtained from Global Dossier (Year: 2020).*

Millapore Sigma, 9-(1-Naphthalenyl)-10-(4-(2-naphthalenyl)phenyl)anthracene, 2025. (Year: 2025).*

Jang, Ji Geun, et al. "TPBI: FIrpic organic light emitting devices with the electron transport layer of Bphen/Alq3." Current Applied Physics 11.1 (2011): S251-S254. (Year: 2011).*

English translation of WO 2019004796 A1 obtained from Global Dossier (Year: 2019).*

Qin, Yumei, et al. "Luminous composite ultrathin films of the DCM dye assembled with layered double hydroxides and its fluorescence solvatochromism properties for polarity sensors." Journal of Materials Chemistry C 3.20 (2015): 5246-5252. (Year: 2015) (Year: 2015).*

China Patent Office, First Office Action issued Jul. 1, 2023 for application No. CN202080002897.5.

* cited by examiner

ORGANIC LIGHT-EMITTING DIODE AND DISPLAY PANEL

TECHNICAL FIELD

The present disclosure relates to the field of display technology, and in particular to an organic light-emitting diode and a display panel.

BACKGROUND

In recent years, a display panel based on an organic light-emitting diode (OLED) has attracted more attention as a new type of a flat display panel. The display panel has characteristics of active luminescence, high brightness, high resolution, wide visual angle, high response speed, low power consumption, flexibility and the like, so that the display panel becomes a mainstream display product. With the continuous development of the product, and for a customer, the requirements on the resolution of the product are higher and higher, and the requirements on the power consumption are lower and lower. It is required to develop a device with high efficiency, low voltage and long lifetime, while an AR/VR product also requires very high resolution. The high resolution and the small aperture ratio require an improvement of brightness of a red OLED, a green OLED, and a blue OLED, and thus the trial and the requirements for the lifetime of the red OLED, the green OLED, and the blue OLED (the OLED of a single color of red, green or blue) are greater. The reduced lifetime of the red OLED, the green OLED and the blue OLED causes the shift of white balance color of the panel product after a long-term use, and a phenomenon such as the reddish, greenish or pinkish picture may occur visually when a white picture is displayed.

SUMMARY

The present disclosure provides an organic light-emitting diode and a display panel including the same.

The organic light-emitting diode includes a first electrode; a second electrode arranged opposite to the first electrode; a light-emitting layer between the first electrode and the second electrode; a hole blocking layer between the light-emitting layer and the second electrode; and an electron transport layer between the hole transport layer and the second electrode, wherein an energy level difference between a HOMO energy level of the hole blocking layer and a HOMO energy level of the light-emitting layer is larger than or equal to 0.1 eV; and an energy level difference between a HOMO energy level of the electron transport layer and the HOMO energy level of the hole blocking layer is larger than or equal to 0.1 eV In some embodiments, an energy level difference between a LUMO energy level of the electron transport layer and a LUMO energy level of the hole blocking layer is larger than or equal to 0.2 eV In some embodiments, the light-emitting layer includes a luminescent host material, and the LUMO energy level of the hole blocking layer is less than a LUMO energy level of the luminescent host material.

In some embodiments, the light-emitting layer includes a blue luminescent material and further includes a luminescent guest material, and a T1 energy level of the electron transport layer is higher than a T1 energy level of the hole blocking layer, the T1 energy level of the hole blocking layer is higher than a T1 energy level of the luminescent guest material, and the T1 energy level of the luminescent guest material is higher than a T1 energy level of the luminescent host material.

In some embodiments, the light-emitting layer includes a red luminescent material or a green luminescent material, and further includes a luminescent guest material, and a T1 energy level of the electron transport layer is higher than a T1 energy level of the hole blocking layer, the T1 energy level of the hole blocking layer is higher than a T1 energy level of the luminescent host material, and the T1 energy level of the luminescent host material is higher than a T1 energy level of the luminescent guest material.

In some embodiments, the electron transport layer includes an electron transport material selected from the following general formula:

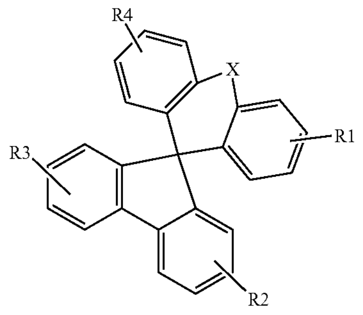

where X includes C, O, S or a single bond of spirofluorene, R1, R2, R3 and R4 are independently selected from a substituted or un-substituted aryl group having 6 to 60 ring carbon atoms or a substituted or un-substituted heteroaryl group having 2 to 60 ring atoms and containing one or more of N, S and O.

In some embodiments, X includes C; and C includes an alkyl group, a silicon group, or a heteroaryl ring.

In some embodiments, at least one of R1, R2, R3, R4 includes a following heteroaryl ring:

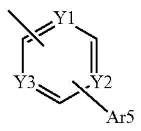

where at least one of Y1, Y2 and Y3 is N, and Ar5 is a substituted or un-substituted aryl group having 6 to 30 ring carbon atoms or a substituted or un-substituted heteroaryl group having 2 to 60 ring carbon atoms and containing one or more of N, S, O.

In some embodiments, the electron transport material includes at least one of the electron transport materials having the following chemical formulas (1-1) to (1-8):

(1-1)
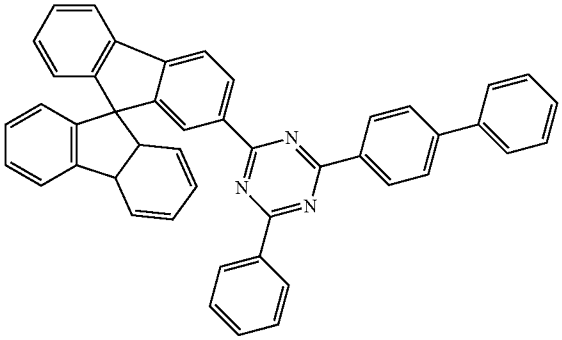
;
(1-2)
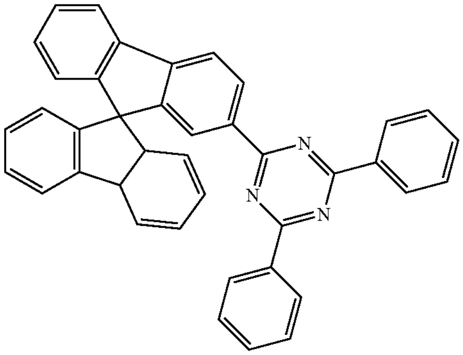
;
(1-3)
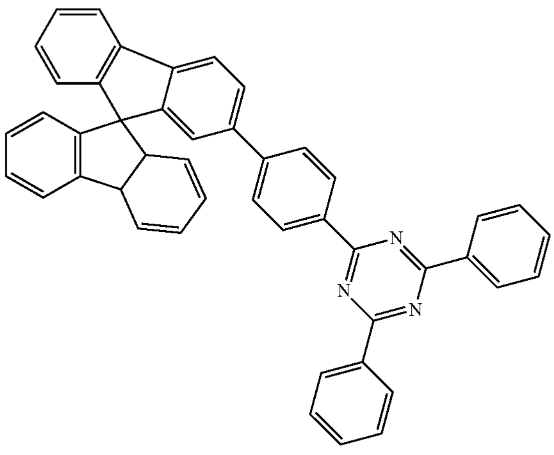
;
-continued
(1-4)
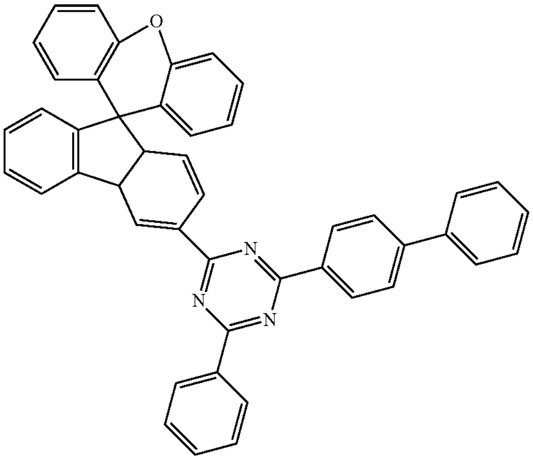
;
(1-5)
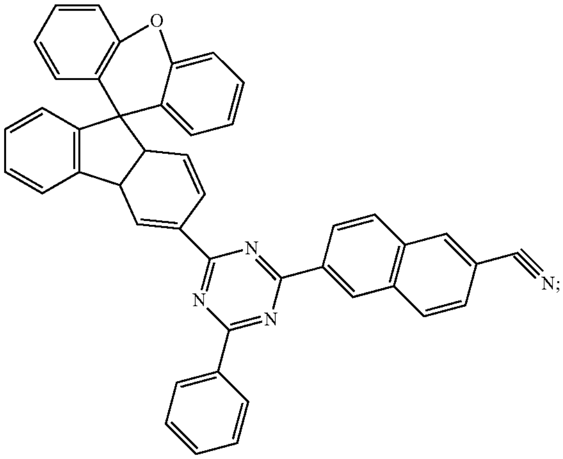
;
(1-6)
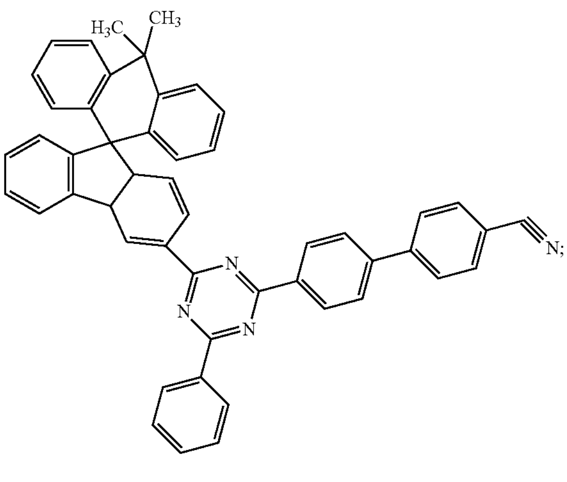
;

-continued (1-7)

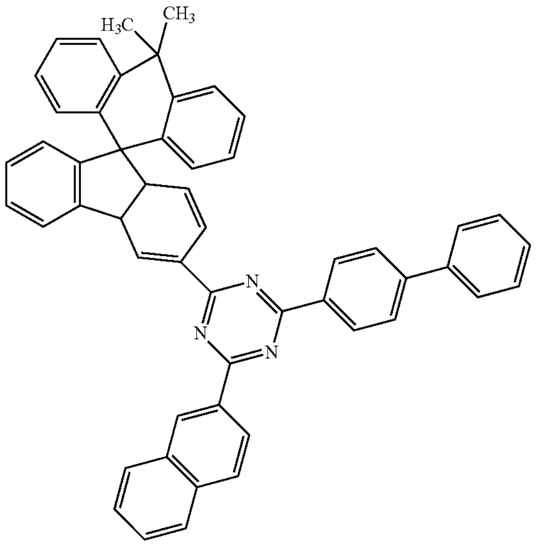

;

(1-8)

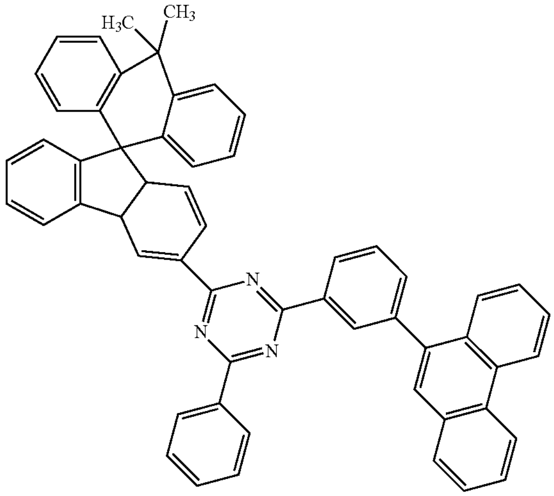

.

In some embodiments, at least one pair of adjacent groups among R1, R2, R3, R4 are linked to form a ring.

In some embodiments, the organic light-emitting diode further includes a light extraction layer on a side of the second electrode distal to the first electrode, wherein the light extraction layer includes a light extraction material having a following formula:

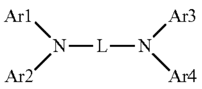

where L is selected from one of a single bond, a substituted or un-substituted arylene group having 6 to 18 carbon atoms, and a substituted or un-substituted heteroarylene group having 3 to 18 carbon atoms; and Ar1, Ar2, Ar3 and Ar4 are independently selected from one of a substituted or un-substituted aryl group having 6 to 60 carbon atoms and a substituted or un-substituted heteroaryl group having 2 to 60 carbon atoms.

In some embodiments, at least one of Ar1, Ar2, Ar3 and Ar4 is selected from a following group:

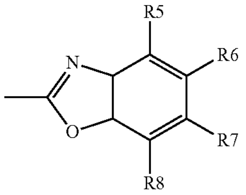

where R5, R6, R7 and R8 are selected from one of a substituted or un-substituted alkyl group having 1 to 30 carbon atoms and a substituted or un-substituted aryl group having 6 to 30 carbon atoms.

In some embodiments, the light extraction material includes at least one of the light extraction materials having the following chemical formulas (2-1) to (2-6):

(2-1)

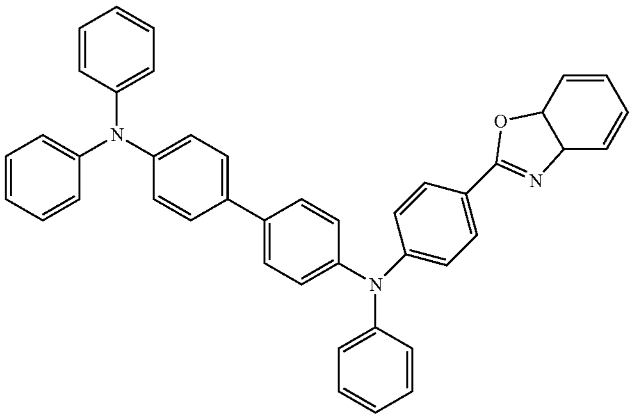

;

-continued
(2-2)
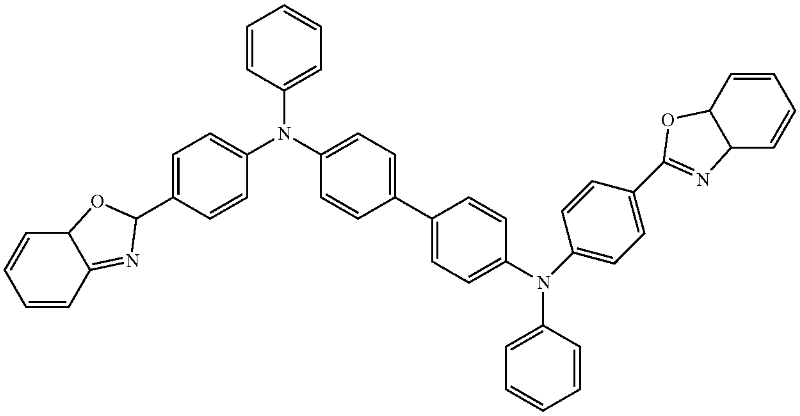
;
(2-3)
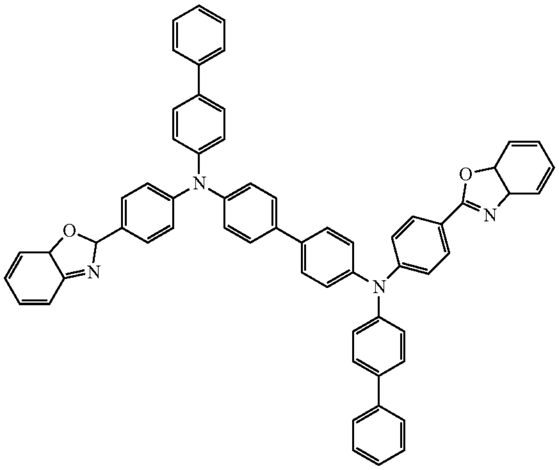
;
(2-4)
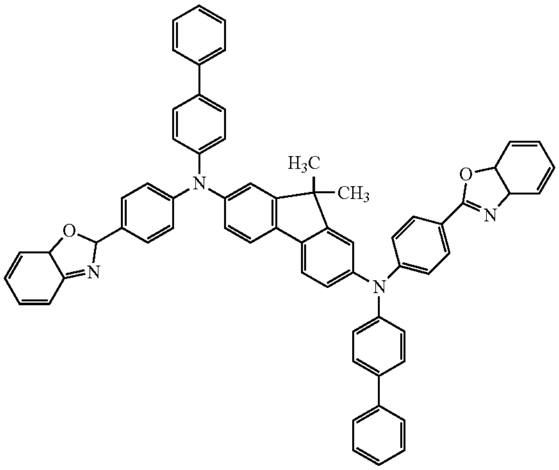
;
(2-5)
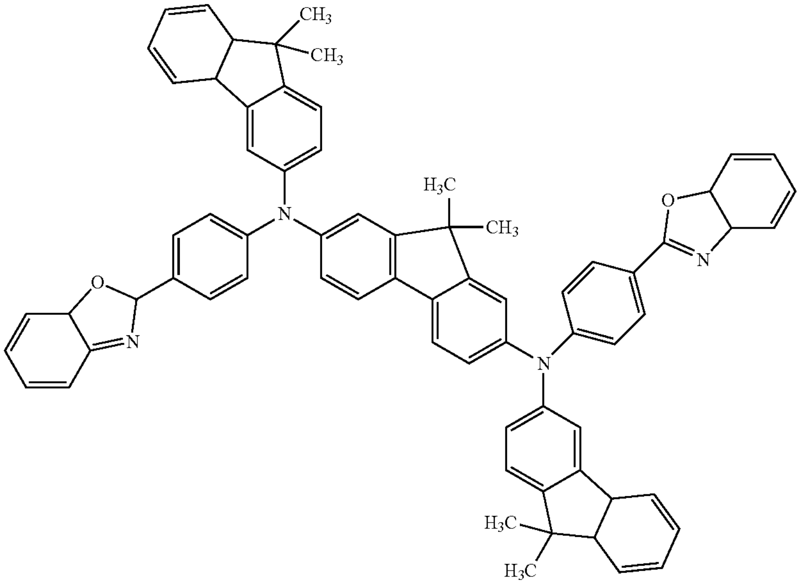
;

-continued (2-6)

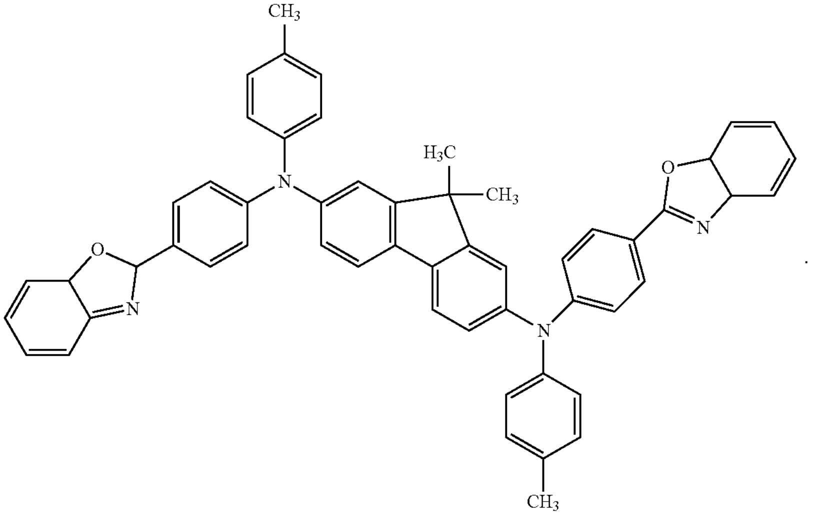

In some embodiments, at least one pair of adjacent groups among R5, R6, R7, R8 are linked to form a ring.

In some embodiments, the organic light-emitting diode further includes a hole injection layer, a hole transport layer, and an electron blocking layer, which are sequentially disposed between the first electrode and the light-emitting layer, and an electron injection layer disposed between the electron transport layer and the second electrode.

The present disclosure further provides a display panel, including the above organic light-emitting diode.

BRIEF DESCRIPTION OF DRAWINGS

In accordance with various disclosed embodiments, the following figures are merely examples for illustrative purposes and are not intended to limit the protection scope of the present disclosure.

DETAIL DESCRIPTION OF EMBODIMENTS

The present disclosure will now be described more particularly with reference to the following examples. It should be noted that the following description of some embodiments presented herein is for the purpose of illustration and description only, and is not intended to be exhaustive or to be limited to the precise form disclosed.

The reduction of the lifetime of a monochrome OLED device of red, green or blue is due to aging of an interface and degradation of materials caused by defects in the materials. In addition, the crystallinity of a material of the electron transport layer (ETL) also has a critical influence on the lifetime of the device, since the material that is easily crystallized is not favorable for a stable lifetime.

The aging of the interface is mainly caused by excessive accumulated charges due to an excessive energy barrier at the interface. In an OLED device, for example, a host material (host) of a light-emitting layer of a blue OLED needs a broadband, so its HOMO level is deep, which causes a large energy level difference between a p-type electron blocking Layer (EBL) and the host material. The presence of this energy barrier causes excessive holes to be accumulated, so that the interface is easily deteriorated and the lifetime of the device is reduced.

Figure 1:
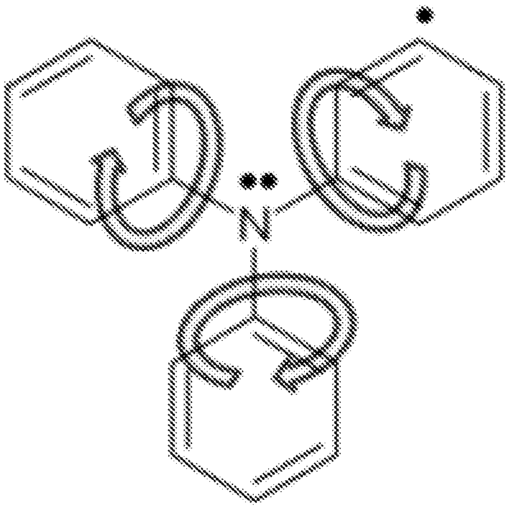
FIG. 1 shows a schematic view illustrating twist of a 6-bond of a benzene ring of aniline of a material of an electron blocking layer of an OLED device.

Among the layers of the OLED device, the material most susceptible to degradation is a material of the EBL, since the material of the EBL itself is generally an electron-rich material, usually containing an aniline structure. A repulsive force will be generated between excessive electrons and electrons in the electron-rich material of the EBL itself. This repulsive force will twist the δ-bond of the benzene ring of the aniline. The twist of the δ-bond caused by an external force will result in a bond breakage, as shown in FIG. 1. The defects caused by the bond breakage are main factors of the reduction of the lifetime of the material and the device.

Reducing electron accumulation on the material of the EBL can improve stability of the device and increase the lifetime of the device. The material of the ETL is more easily crystallized than materials of other layers due to the structural characteristics of the material of the ETL. The crystallized material further results in an unstable OLED and causes the interface to age too fast, which affects the lifetime of the OLED.

Figure 2:
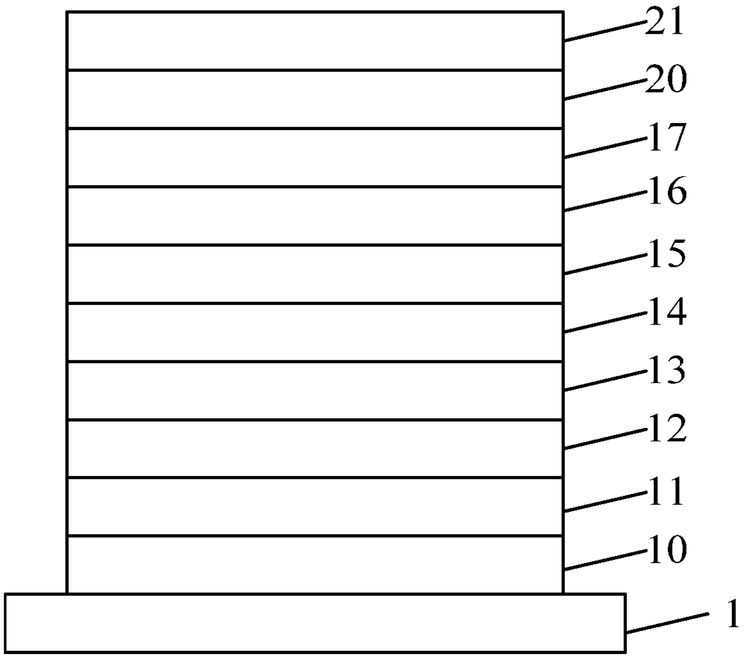
FIG. 2 is a cross-sectional view of an OLED device according to some embodiments of the present disclosure.

In view of the above problems, the present disclosure provides, inter alia, an organic light-emitting diode with an improved lifetime. As shown in FIG. 2, the organic light-emitting diode of the present disclosure may include a substrate 1, and a first electrode 10, a hole injection layer (HIL) 11, a hole transport layer (HTL) 12, an electron blocking layer (EBL) 13, a light-emitting layer (EML) 14, a hole blocking layer (HBL) 15, an electron transport layer (ETL) 16, an electron injection layer (EIL) 17, and a second electrode 20 sequentially disposed on the substrate 1.

The organic light-emitting diode of the present disclosure is not limited to the organic light-emitting diode as shown in FIG. 2. For example, it may include only the first electrode 10, the light-emitting layer 14, the hole blocking layer 15, the electron transport layer 16, and the second electrode 20. That is, the specific configuration of the organic light-emitting diode may be determined according to specific requirements, and the present disclosure is not limited thereto.

In the present disclosure, the first electrode 10 may be an anode, and the second electrode 20 may be a cathode. When a driving current is supplied to the OLED, electrons are injected into the light-emitting layer 14 from the second electrode 20, and holes are injected into the light-emitting layer 14 from the first electrode 10. Since the material of the light-emitting layer is intended to be of an electron transport type, it is good for the electrons to be transported, so that a large number of electrons reach the light-emitting layer 14, and the current efficiency of the OLED can be improved. However, when the number of electrons is greater than that of holes in the light-emitting layer 14, too many electrons cannot be recombined, and the portion of the electrons that cannot be recombined are transported into film layer(s) between the light-emitting layer 14 and the first electrode 10, which may damage the performance of the film layer(s) and the interface between any two adjacent film layers (e.g., the interface between the light-emitting layer 14 and the electron blocking layer 13), cause the degradation of the performance of the film layer(s) between the light-emitting layer 14 and the first electrode 10 of the OLED, and cause the interface between any two adjacent film layers in the film layers between the light-emitting layer 14 and the first electrode 10 to be damaged, thereby causing the lifetime of the OLED to be reduced.

On the other hand, the luminescent principle of the OLED mainly includes four processes of injection, transport, and recombination of carriers (electrons or holes), and de-excitation of excitons to emit light. Specifically, when a certain voltage is applied to the OLED (i.e., a driving current is supplied to the OLED), holes of the first electrode 10 (anode) and electrons of the second electrode 20 (cathode) are respectively injected into the light-emitting layer 14 (i.e. the process of the carriers injection); the injected electrons and holes are transported under an electric field (i.e. the process of carriers transport); electrons and holes recombine in the light-emitting layer 14 by coulomb interaction to generate excitons (i.e. the process of carriers recombination); the excitons return from the excited state to the ground state while releasing photons to emit light (i.e. the process of excitons de-excitation to emit light). The hole blocking layer 15 is arranged between the light-emitting layer 14 and the second electrode 20 (cathode), and its function is mainly embodied in two aspects: on one hand, holes can be prevented from transporting from the light-emitting layer 14 to the second electrode 20, so that more holes can be confined in the light-emitting layer 14; on the other hand, it is advantageous for the electrons to be transported from the second electrode 20 to the light-emitting layer 14, so that the number of electrons in the light-emitting layer 14 can be increased.

Figure 3:
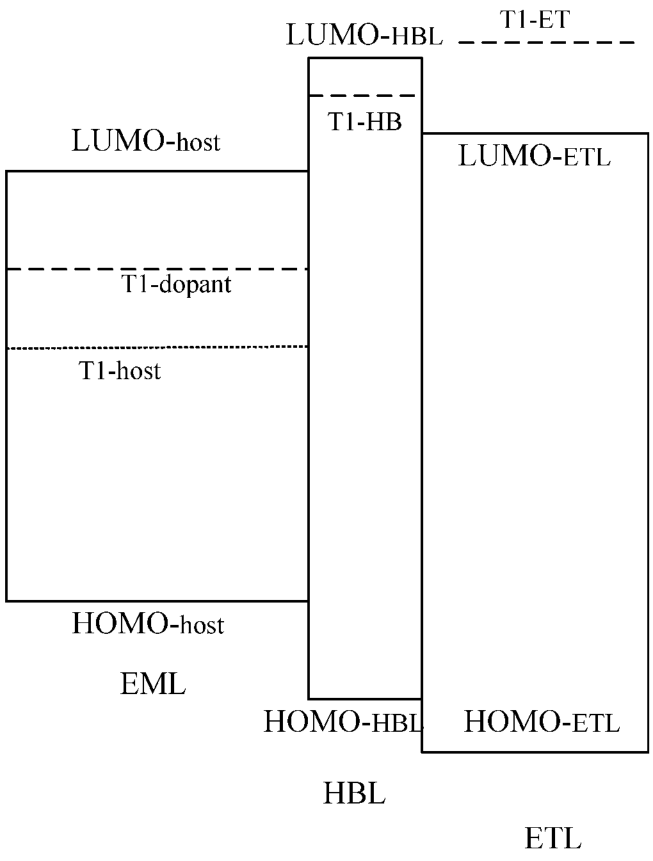
FIG. 3 shows a schematic view illustrating HOMO, LUMO and T1 energy levels of a light-emitting layer, a hole blocking layer and an electron transport layer of an OLED device according to some embodiments of the present disclosure.

As shown in FIG. 3, in order to further strengthen the function of the hole blocking layer 15 preventing excessive electrons from accumulating at the interface between the light-emitting layer 14 and the electron blocking layer 13, in the present disclosure, the energy level difference between the Highest Occupied Molecular Orbital (HOMO) energy level of the hole blocking layer 15 and the HOMO energy level of the light-emitting layer EML is 0.1 eV or more. With this configuration, holes can be efficiently confined in the light-emitting layer 14, and the holes can be blocked from being transported towards the second electrode 20, and thus, are not quenched by the second electrode 20.

In one embodiment, an energy level difference between the HOMO energy level of the electron transport layer 16 arranged between the hole blocking layer 15 and the second electrode 20 and the HOMO energy level of the hole blocking layer 15 is 0.1 eV or more.

With this configuration, the electron transport layer 16 can block holes, and the hole blocking layer 15 (for example, which has a thickness in a range of about 5 nm to 15 nm) is prevented from being too thin which causes electrons to be quenched by holes passing through the hole blocking layer 15.

In one embodiment, the energy level difference between the Lowest Unoccupied Molecular Orbital (LUMO) energy level of the electron transport layer 16 and the LUMO energy level of the hole blocking layer 15 is 0.2 eV or more. With this configuration, electrons in the electron transport layer 16 can be better controlled to slow down the transport of electrons to the light-emitting layer 14, so that a region for recombination can be better controlled.

In one embodiment, the light-emitting layer 14 includes a luminescent host (host) material and a luminescent guest (dopant) material. Alternatively, the LUMO energy level of the hole blocking layer 15 is smaller than that of the luminescent host material. With this configuration, some electrons can be scattered out of the light-emitting layer.

In one embodiment, the light-emitting layer 14 includes a blue luminescent material, the triplet energy level (T1 energy level) of the electron transport layer 16 is higher than the T1 energy level of the hole blocking layer 15, the T1 energy level of the hole blocking layer 15 is higher than the T1 energy level of the luminescent guest material of the blue luminescent material, and the T1 energy level of the luminescent guest material is higher than the T1 energy level of the luminescent host material. With such a configuration, excitons can be confined in the light-emitting layer 14, and the density of the excitons can be effectively increased by utilizing the TTA (triple-tripleannihilation) mechanism (for the blue fluorescent luminescent material), thereby improving the luminescent efficiency.

In one embodiment, the light-emitting layer 14 includes a red or green luminescent material, the T1 energy level of the electron transport layer 16 is higher than the T1 energy level of the hole blocking layer 15, the T1 energy level of the hole blocking layer 15 is higher than the T1 energy level of the luminescent host material, and the T1 energy level of the luminescent host material is higher than the T1 energy level of the luminescent guest material. With this configuration, excitons can be confined in the light-emitting layer 14, and the density of the excitons can be effectively increased by a phosphorescence mechanism (for a red/green phosphorescent luminescent material), thereby improving the luminescent efficiency.

As can be seen from the above, in the organic light-emitting diode of the present disclosure, the HOMO energy level and the LUMO energy level of each of the light-emitting layer 14, the hole blocking layer 15, and the electron transport layer 16 are set as above. On one hand, electrons in the electron transport layer can be controlled to slow down the transport of electrons to the light-emitting layer 14, so as to avoid the accumulation of excess electrons at the interface between the electron blocking layer and the light-emitting layer; on the other hand, holes can be effectively confined in the light-emitting layer 14 to eliminate hole quenching, whereby accumulation of excess electrons at the interface between the electron blocking layer and the light-emitting layer can be further avoided. In addition, the T1 energy level of each of the light-emitting layer 14, the hole blocking layer 15, and the electron transport layer 16 is set as described above, and excitons are confined in the guest material by the TTA mechanism (blue phosphorescent material)/phosphorescence mechanism (red/green phosphorescent material), thereby preventing energy from being diffused into the host material or other functional layers, and therefore, the exciton emission density can be effectively increased.

The first electrode 10 may be an anode, and for example, the material of the first electrode 10 may be Indium Tin Oxide (ITO), or may alternatively be a laminated composite of indium tin oxide layer/silver layer/indium tin oxide layer (ITO/Ag/ITO); the second electrode 20 may be a cathode, and for example, the material of the second electrode 20 may be a metal material, such as a conductive material with a low work function, for example, aluminum (Al), gold (Au), silver (Ag), or a metal alloy including Ag. Therefore, the first electrode 10 may be a reflective anode, and the second electrode 20 may be a transparent cathode.

The light-emitting layer 14 may include one material or two or more materials, including a host material and a guest material, for example. The luminescent material includes a blue luminescent material, a green luminescent material, or a red luminescent material according to the color of light to be emitted.

The blue luminescent material is selected from pyrene derivatives, anthracene derivatives, fluorene derivatives, perylene derivatives, styrylamine derivatives, metal complexes and the like, for example, N1,N6-bis([1,1'-biphenyl]-2-yl)-N1,N6-bis([1,1'-biphenyl]-4-yl) pyrene-1,6-diamine, 9,10-bis-(2-naphthyl) anthracene (ADN), 2-methyl-9,10-bis-2-naphthyl anthracene (MADN), 2,5,8,11-tetra-tert-butyl perylene (TBPe), 4,4'-bis [4-(diphenylamino) styryl] biphenyl (BDAV Bi), 4,4'-bis[4-(di-p-tolylamino) styryl] biphenyl (DPAVBi), bis(4,6-difluorophenylpyridine-C2,N) picolinate iridium (Firpic).

The green luminescent material is selected from coumarin dyes, quinacridone derivatives, polycyclic aromatic hydrocarbons, diamine anthracene derivatives, carbazole derivatives, metal complexes, etc., such as coumarin 6 (C-6), coumarin 545T (C-545T), quinacridone (QA), N,N'-Dimethyl quinacridone (DMQA), 5,12-Diphenyl naphthalene (DPT), N10,N10'-Diphenyl-N10,N10'-Dibenzoyl-9,9'-dianthracene-10,10'-diamine (BA-NPB), tris(8-hydroxyquinoline) aluminum (III) (Alq3), tris (2-phenylpyridine) iridium (Ir(ppy)3), and bis (2-phenylpyridine) iridium acetylacetonate (Ir (ppy) 2 (acac)).

The red luminescent material is selected from DCM series materials, metal complexes and the like, specifically, 4-(dicyanomethylene)-2-methyl-6-(4-dimethylamino styryl)-4H-pyran (DCM), 4-(Dicyano methylene)-2-tert-butyl-6-(1,1,7,7-tetramethyl julolidine-9-enyl)-4H-pyran (DCJTB), bis(1-benzylisoquinoline) (acetylacetone) iridium (III) (Ir (piq) 2 (acac)), platinum octaethylporphyrin (PtOEP), bis(2-(2'-benzothienyl) pyridine-N,C3') (acetylacetonato) iridium (Ir (btp)2(acac), and the like.

The hole injection layer 11 may include an inorganic oxide: molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, p-type dopants which has strong electrophilic ability, and dopants of a hole transport material, such as hexacyano hexaaza triphenylene, 2,3,5,6-tetrafluoro-7,7,8,8-tetracyano-p-quinodimethane (F4TCNQ), 1,2,3-tris[(cyano) (4-cyano-2,3,5,6-tetrafluorophenyl) methylene] cyclopropane, and the like.

The materials of the hole transport layer 12 and the electron blocking layer 13 may be arylamine-based or carbazole-based materials having hole transport properties, such as 4,4'-bis[N-(1-naphthyl)-N-phenylamino] biphenyl (NPB), N,N'-bis(3-methylphenyl)-N,N'-diphenyl-[1,1'-biphenyl]-4,4'-diamine (TPD), 4-phenyl-4'-(9-phenyl fluoren-9-yl) triphenylamine (BAFLP), 4,4'-bis[N-(9,9-dimethyl fluoren-2-yl)-N-phenylamino] biphenyl (DFLDPBi), 4,4'-bis(9-carbazolyl) biphenyl (CBP), 9-phenyl-3-[4-(10-phenyl-9-anthryl) phenyl]-9H-carbazole (PCzPA), and the like.

The hole blocking layer 15 and the electron transport layer 16 generally include aromatic heterocyclic compounds, such as imidazole derivatives, e.g., benzimidazole derivatives, imidazo pyridine derivatives, benzimidazole phenanthridine derivatives and the like; oxazine derivatives, e.g., pyrimidine derivatives, triazine derivatives and the like; and compounds each containing a nitrogen-containing six-membered ring structure (including compounds having a phosphine oxide substituent on the heterocycle), e.g., quinoline derivatives, isoquinoline derivatives, phenanthroline derivatives and the like, such as, 2-(4-biphenylyl)-5-(4-tert-butyl phenyl)-1,3,4-oxadiazole (PBD), 1,3-bis[5-(p-tert-butyl phenyl)-1,3,4-oxadiazol-2-yl] benzene (OXD-7), 3-(4-tert-butyl phenyl)-4-phenyl-5-(4-biphenylyl)-1,2,4-triazole (TAZ), 3-(4-tert-butyl phenyl)-4-(4-ethyl phenyl)-5-(4-biphenylyl)-1,2,4-triazole (p-EtTAZ), bathophenanthroline (BPhen), bathocuproine (BCP), 4,4'-bis(5-methylbenz oxazol-2-yl) stilbene (BzOs), and the like.

The material of the electron injection layer 17 typically includes an alkali metal or a metal, such as LiF, Yb, Mg, Ca, or a compound thereof.

In one embodiment, in order not only to satisfy the relationship among energy levels of the light-emitting layer 14, the hole blocking layer 15, and the electron transport layer 16 of the OLED device of the present disclosure described above, but also to increase the stability of the material of the electron transport layer 16 to extend the lifetime of the OLED device, the material of the electron transport layer 16 of the present disclosure may include an electron transport material that is not easily crystallized and is selected from the following general formula:

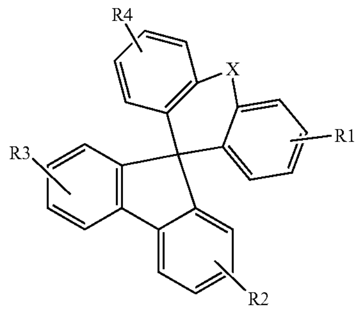

Where X is C, O, S or a single bond of spirofluorene, and R1, R2, R3 and R4 are each independently a substituted or un-substituted aryl group having 6 to 60 ring carbon atoms or a substituted or un-substituted heteroaryl group having 2 to 60 ring atoms and containing one or more of N, S, O.

The electron transport material is a material containing a spiro structure, which is a vertical three-dimensional structure, and has a twist angle of 90°, thereby forming a large steric hindrance, so that the crystallinity of the electron transport material can be effectively reduced, and the stability of the electron transport material is improved.

In one embodiment, X in the above formula is C, and therefore, C may be substituted by an alkyl group, silicon group, or a heteroaryl ring. Alternatively, at least one of R1, R2, R3, R4 includes a following heteroaryl ring:

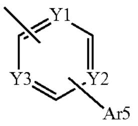

Where at least one of Y1, Y2 and Y3 is N, and Ar5 is a substituted or un-substituted aryl group having 6 to 30 ring carbon atoms or a substituted or un-substituted heteroaryl group having 2 to 60 ring atoms and containing one or more of N, S, O. In addition, R1, R2, R3 and R4 can be adjacently connected to form a ring, that is, any two adjacent or non-adjacent groups of R1, R2, R3 and R4 can be connected together.

Examples of the electron transport material having the above general formula have, for example, the following chemical formulas 1-1 to 1-8:

(1-1)

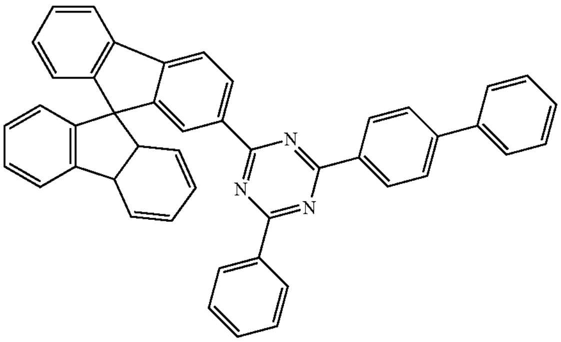

;

(1-2)

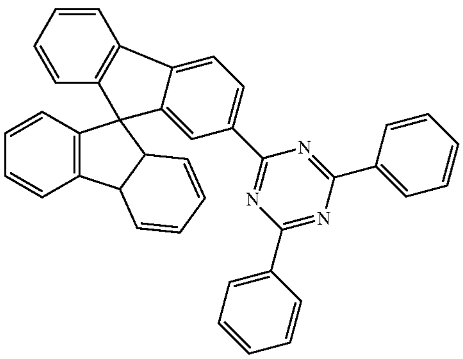

;

-continued (1-3)

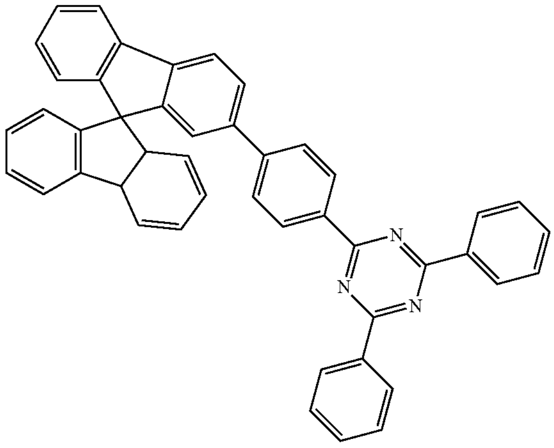

;

(1-4)

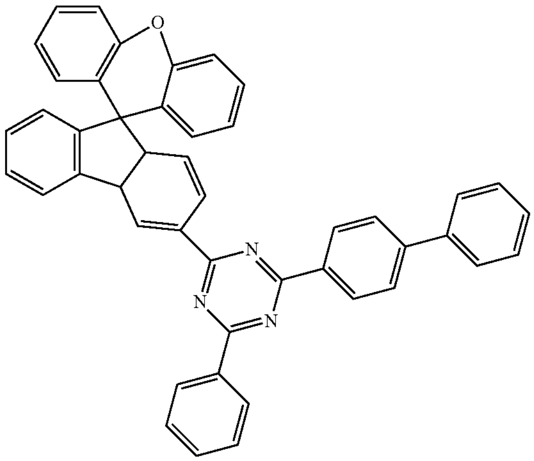

;

(1-5)

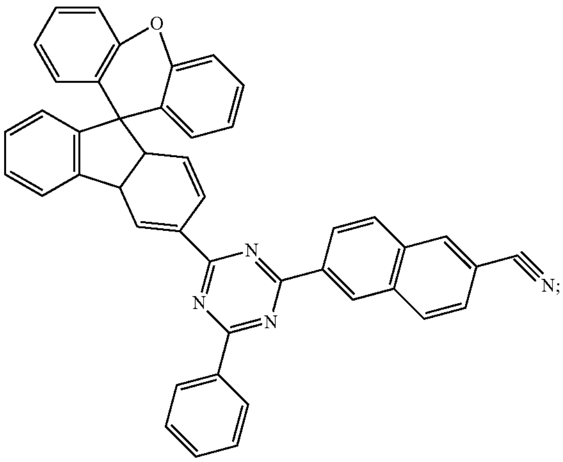

;

-continued (1-6)

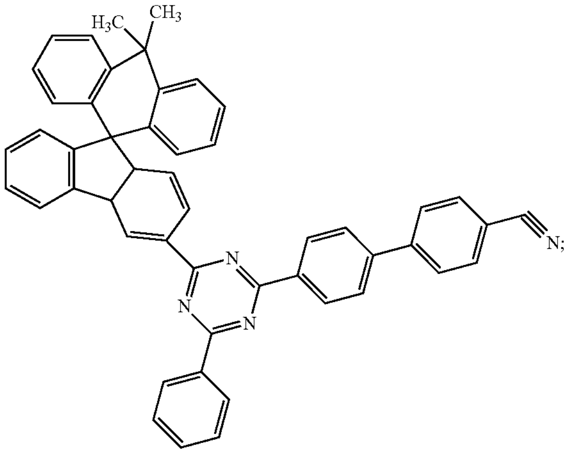

(1-7)

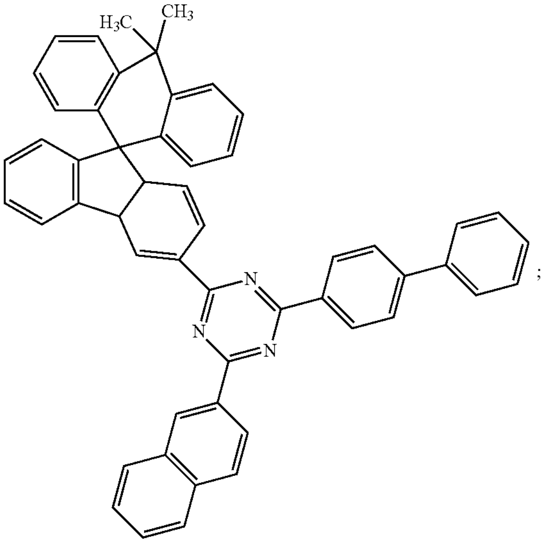

(1-8)

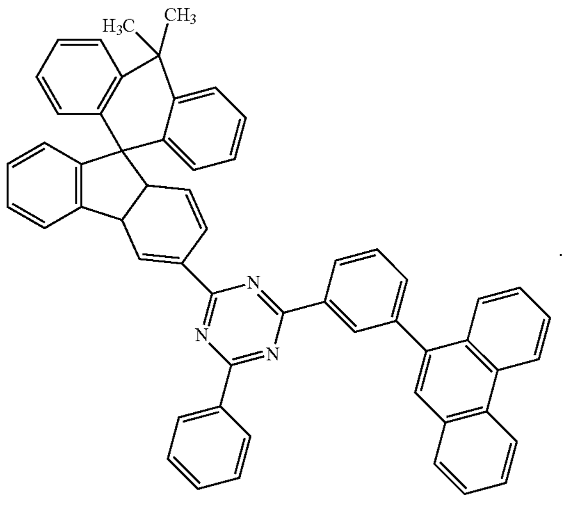

The steric hindrance of the electron transport material is increased, such that the crystallinity of the electron transport material is reduced, the stability of the electron transport layer made of the electron transport material in an OLED device is improved, and the lifetime of the OLED device is prolonged.

In order to increase the light extraction efficiency of the OLED device, the OLED device may typically further include a light extraction layer (CPL) at a light outgoing side. A refractive index of a conventional light extraction layer is generally between 1.7 and 1.8.

In the present disclosure, in order to further improve the light coupling-output of the OLED device, improve the light extraction efficiency, and improve the external quantum efficiency (EQE), in one embodiment, the OLED device of the present disclosure further includes a light extraction layer (CPL) 21 on a side of the second electrode 20 distal to the first electrode 10, as shown in FIG. 2, and the refractive index of the light extraction layer is greater than or equal to 1.9. That is, the light extraction layer of the embodiment of the present disclosure is made of a high-refractive-index group material, and the material of the light extraction layer includes a light extraction material selected from the following general formula:

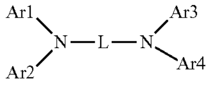

Where L is one selected from a single bond, a substituted or un-substituted arylene group having 6 to 18 carbon atoms, and a substituted or un-substituted heteroarylene group having 3 to 18 carbon atoms; Ar1, Ar2, Ar3 and Ar4 are independently selected from one of a substituted or un-substituted aryl with 6 to 60 carbon atoms and a substituted or un-substituted heteroaryl with 2 to 60 carbon atoms; R5, R6, R7 and R8 are selected from one of a substituted or un-substituted alkyl group with 1 to 30 carbon atoms and a substituted or un-substituted aryl group with 6 to 30 carbon atoms. Alternatively, at least one pair of adjacent substituents of R5, R6, R7, R8 may form a ring fusion, e.g., adjacent or non-adjacent ones of these four groups may be joined together to form a ring. In one embodiment, at least one of Ar1, Ar2, Ar3, or Ar4 is selected from the following groups, and a material having the group can effectively adjust the refractive index of the light extraction material:

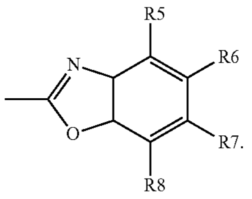

Examples of the light extraction material having the above general formula have, for example, the following chemical formulas 2-1 to 2-6:

(2-1)
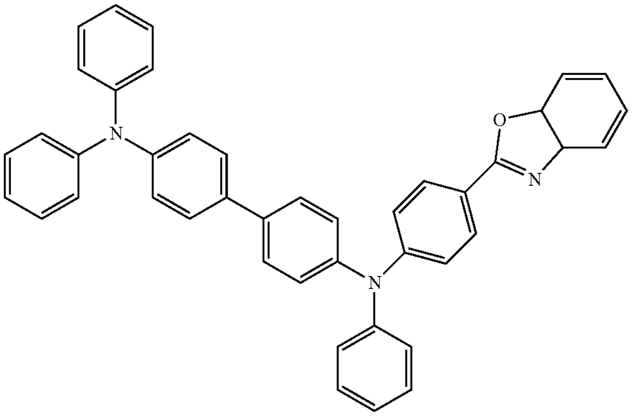
;
(2-2)
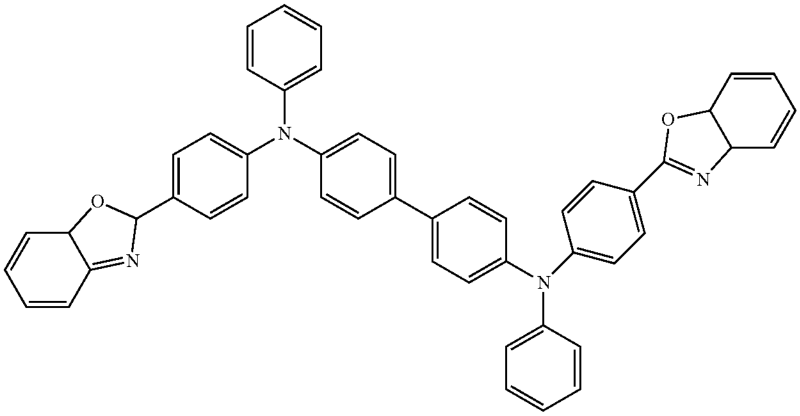
;
(2-3)
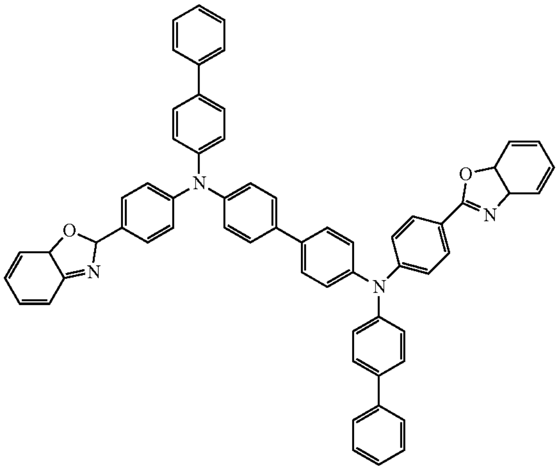
;
(2-4)
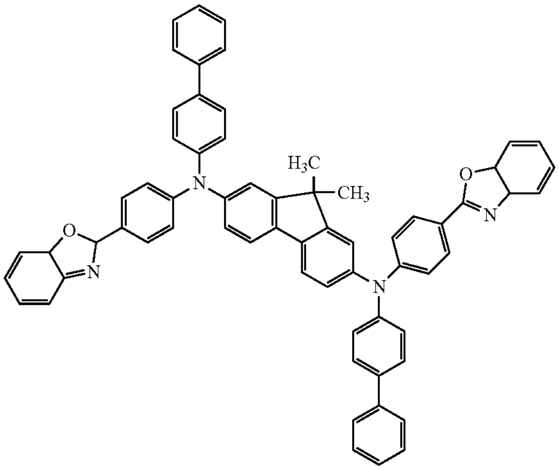
;

-continued
(2-5)
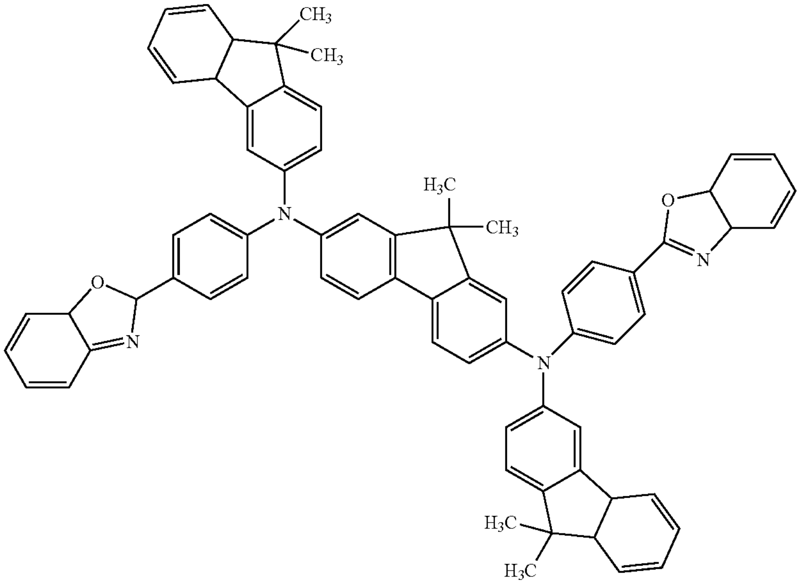
;
(2-6)
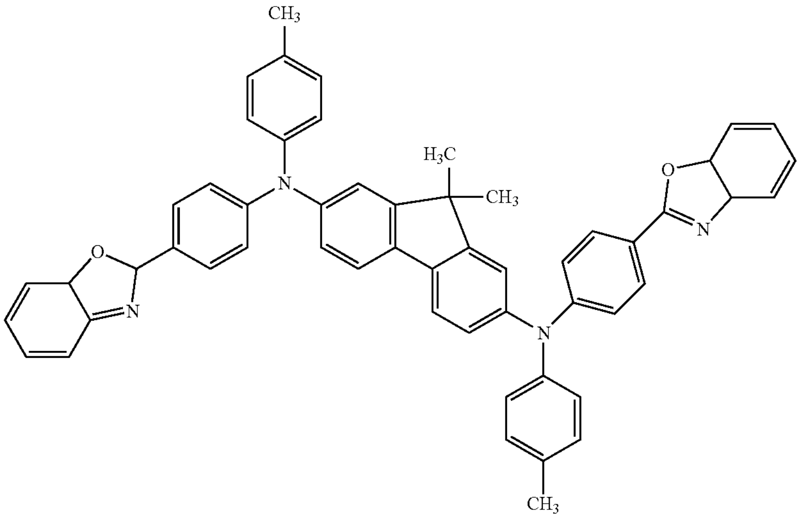
.
Table 1 below shows a comparison of the respective properties of the OLED devices obtained using the following materials and the respective electron transport materials 1-1 to 1-8 and the respective light extraction materials 2-1 to 2-6 of the present disclosure as described above:
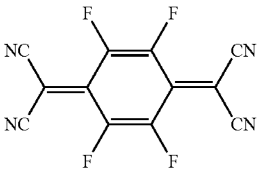 [SMILES: N#CC(C#N)=c1c(F)c(F)c(=C(C#N)C#N)c(F)c1F]

Hole injection layer: p-type doping (F4TCNQ)
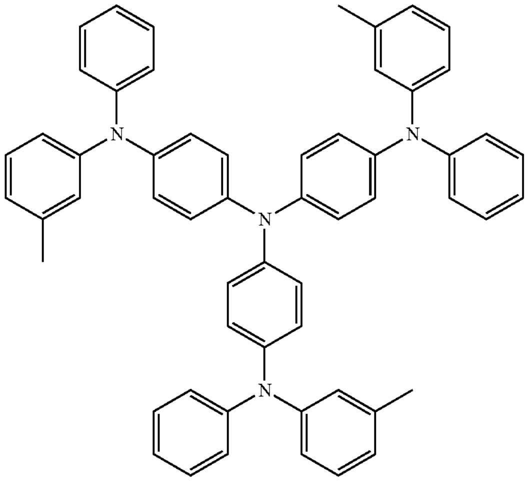 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1]
Hole transport layer: HT (m-MTDATA)
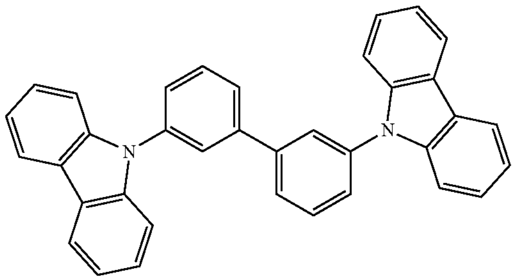 [SMILES: c1cc(-c2cccc(-n3c4ccccc4c4ccccc43)c2)cc(-n2c3ccccc3c3ccccc32)c1]
Electron blocking layer: EBL (mCBP)
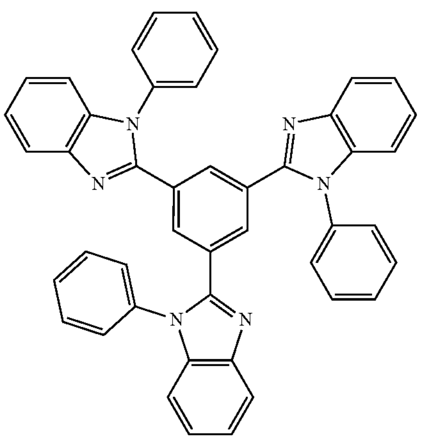 [SMILES: c1ccc(-n2c(-c3cc(-c4nc5ccccc5n4-c4ccccc4)cc(-c4nc5ccccc5n4-c4ccccc4)c3)nc3ccccc32)cc1]
Hole blocking layer: HBL (TPBI)
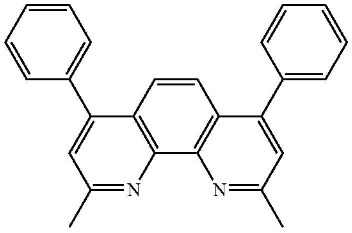 [SMILES: Cc1cc(-c2ccccc2)c2ccc3c(-c4ccccc4)cc(C)nc3c2n1]
Electron transport layer: comparative ETL (BCP)
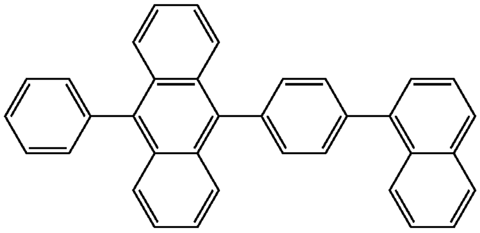 [SMILES: c1ccc(-c2c3ccccc3c(-c3ccc(-c4cccc5ccccc45)cc3)c3ccccc23)cc1]
Host material of light-emitting layer: BH(9-(4-(naphthalen-1-yl)phenyl)-10-phenylanthracene)
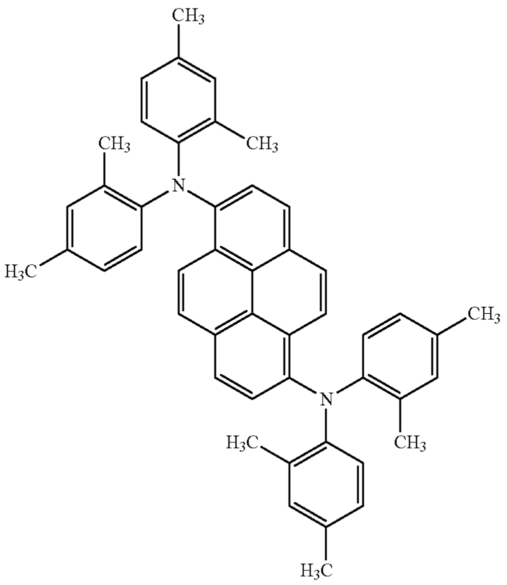
Guest material of light-emitting layer: BD (N1,N1,N6-tris(2,4-dimethylphenyl)-N6-(o-tolyl)pyrene-1,6-diamine)

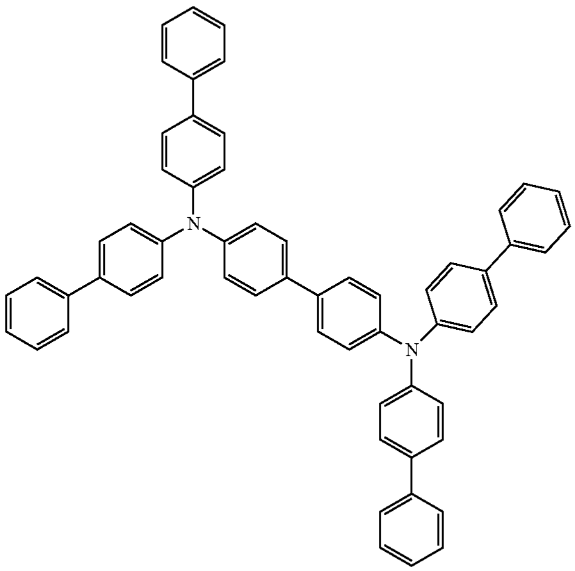 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

Light extraction layer: comparative CPL (N4,N4,N4',N4'-tetra([1,1'-biphenyl]-4-yl)-[1,1'-biphenyl]-4,4'-diamine)

TABLE 1

| OLED device | Material combination | | Voltage | EQE | Lifetime (LT95@1000nit) |
|---|---|---|---|---|---|
| A | Comparative ET | Comparative CPL | 100% | 100% | 100% |
| B | Comparative ET | 2-2 | 99% | 109% | 101% |
| C | Comparative ET | 2-4 | 100% | 113% | 101% |
| D | 1-2 | Comparative CPL | 97% | 102% | 114% |
| E | 1-4 | Comparative CPL | 95% | 104% | 121% |
| F | 1-6 | Comparative CPL | 98% | 100% | 118% |
| G | 1-2 | 2-2 | 96% | 115% | 113% |
| H | 1-4 | 2-2 | 95% | 116% | 126% |
| I | 1-6 | 2-2 | 99% | 109% | 119% |
| J | 1-2 | 2-4 | 97% | 118% | 111% |
| K | 1-4 | 2-4 | 96% | 129% | 119% |
| L | 1-6 | 2-4 | 99% | 112% | 115% |

In the above table 1, the materials of the hole injection layer, the hole transport layer, the electron blocking layer, the light-emitting layer (including host material and guest material), and the hole blocking layer in each of the OLED devices A to L are all those as described above. These OLED devices are different from each other in that different materials are used for the electron transport layer and the light extraction layer. For example, the material of the electron transport layer of the OLED device A is the comparative ET as described above, while the material of the light extraction layer of the OLED device A is the comparative CPL as described above; the material of the electron transport layer of the OLED device B is the comparative ET as described above, and the material of the light extraction layer is the light extraction layer material 2-2 of the present disclosure; the material of the electron transport layer of the OLED device C is the comparative ET as described above, while the material of the light extraction layer of the OLED device C is the light extraction material 2-4 of the present disclosure; the material of the electron transport layer of the OLED device D is the electron transport material 1-2 of the present disclosure, while the material of the light extraction layer of the OLED device D is the comparative CPL as described above; the material of the electron transport layer of the OLED device E is the electron transport material 1-4 of the present disclosure, while the material of the light extraction layer of the OLED device E is the comparative CPL as described above; the material of the electron transport layer of the OLED device F is the electron transport material 1-6 of the present disclosure, while the material of the light extraction layer of the OLED device F is the comparative CPL as described above; the material of the electron transport layer of the OLED device G is the electron transport material 1-2 of the present disclosure, and the material of the light extraction layer of the OLED device G is the light extraction material 2-2 of the present disclosure; the material of the electron transport layer of the OLED device H is the electron transport material 1-4 of the present disclosure, and the material of the light extraction layer of the OLED device H is the light extraction material 2-2 of the present disclosure; the material of the electron transport layer of the OLED device I is the electron transport material 1-6 of the present disclosure, and the material of the light extraction layer of the OLED device I is the light extraction material 2-2 of the present disclosure; the material of the electron transport layer of the OLED device J is the electron transport material 1-2 of the present disclosure, and the material of the light extraction layer of the OLED device J is the light extraction material 2-4 of the present disclosure; the material of the electron transport layer of the OLED device K is the electron transport material 1-4 of the present disclosure, and the material of the light extraction layer of the OLED device K is the light extraction material 2-4 of the present disclosure; the material of the electron transport layer of the OLED device L is the electron transport material 1-6 of the present disclosure, and the material of the light extraction layer of the OLED device L is the light extraction material 2-4 of the present disclosure.

As can be seen from the above table 1, the efficiency and lifetime of the OLED device formed by using the energy level configuration and the material combination of the OLED device of the present disclosure are improved to different degrees. For example, if the electron transport layer with the electron transport material represented by one of the general formulas 1-1 to 1-8 and the light extraction layer with the light extraction material represented by one of the general formulas 2-1 to 2-6 are both used together, the lifetime and efficiency of the OLED device (e.g., OLED device G, H, I, J, K or L) can be greatly improved.

It should be noted that each of the above film layers of the OLED device of the present disclosure may be formed by evaporation, sputtering, inkjet printing, or any other film forming method known to one of ordinary skill in the art, and the embodiments of the present disclosure are not limited thereto. According to the embodiment of the present disclosure, with the above energy level configuration of the light-emitting layer 14, the hole blocking layer 15 and the electron transport layer 16 and the specific selection of the materials of the electron transport layer 16 and the light extraction layer 21, holes can be effectively prevented from transporting from the light-emitting layer 14 to the second electrode 20, so that the number of electron-hole pairs in the light-emitting layer 14 can be increased, more electrons and holes are recombined in the light-emitting layer 14 for light emission, and the luminescent efficiency of the OLED is improved; meanwhile, since more electrons are recombined, the damage of the electrons to the electron blocking layer 13 and the light-emitting layer 14 and the interface between the two layers can be relieved, and the lifetime of the OLED can be prolonged while the luminescent efficiency of the OLED is improved.

The present disclosure also provides a display panel including the above OLED. Since the luminescent efficiency and the lifetime of the OLED are improved, the performance of the display panel is also improved accordingly.

The foregoing descriptions of embodiments of the present disclosure have been presented for purposes of illustration and description. It is not intended to be exhaustive or to limit the disclosure to the precise form or exemplary embodiments disclosed. The foregoing description is, therefore, to be considered illustrative rather than restrictive. Obviously, many modifications and variations will be apparent to a person skilled in the art. The embodiments were chosen and described in order to explain the principles of the disclosure to enable a person skilled in the art to understand the invention for various embodiments and various modifications as are suited to the particular use or implementation contemplated. It is intended that the scope of the invention is defined by the following claims and their equivalents.

What is claimed is:

1. An organic light-emitting diode, comprising:

a first electrode;

a second electrode opposite to the first electrode;

a light-emitting layer between the first electrode and the second electrode;

a hole blocking layer between the light-emitting layer and the second electrode; and an electron transport layer between the hole blocking layer and the second electrode, wherein an energy level difference between a HOMO energy level of the hole blocking layer and a HOMO energy level of the light-emitting layer is larger than or equal to 0.1 eV; and an energy level difference between a HOMO energy level of the electron transport layer and the HOMO energy level of the hole blocking layer is larger than or equal to 0.1 eV;

wherein the light-emitting layer comprises a blue luminescent material; and wherein the blue luminescent material comprises a blue luminescent host material and a blue luminescent guest material, and a T1 energy level of the electron transport layer is higher than a T1 energy level of the hole blocking layer, the T1 energy level of the hole blocking layer is higher than a T1 energy level of the blue luminescent guest material, and the T1 energy level of the blue luminescent guest material is higher than a T1 energy level of the blue luminescent host material;

the blue luminescent host material comprises BH (9-(4-(naphthalen-1-yl)phenyl)-10-phenylanthracene) which has the following formula:

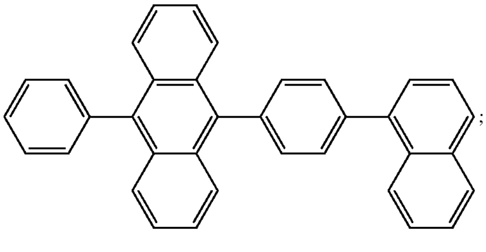 [SMILES: c1ccc(-c2c3ccccc3c(-c3ccc(-c4cccc5ccccc45)cc3)c3ccccc23)cc1]

;

the blue luminescent guest material comprises BD (N1,N1,N6-tris(2,4-dimethylphenyl)-N6-(o-toyl)pyrene-1,6-diamine) which has the following formula:

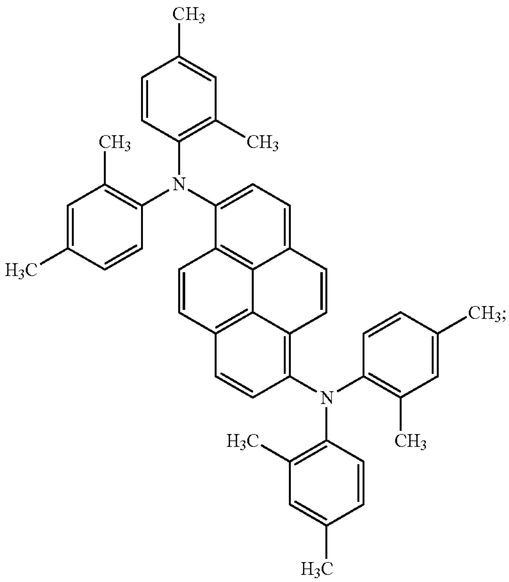 [SMILES: Cc1ccc(N(c2ccc(C)cc2C)c2ccc3ccc4c(N(c5ccc(C)cc5C)c5ccc(C)cc5C)ccc5ccc2c3c54)c(C)c1]

;

the hole blocking layer comprises a material of TPBI which has the following formula:

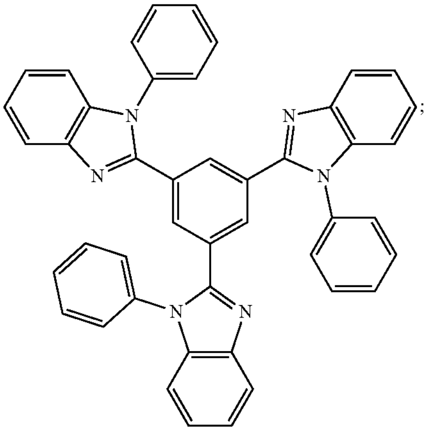 [SMILES: c1ccc(-n2c(-c3cc(-c4nc5ccccc5n4-c4ccccc4)cc(-c4nc5ccccc5n4-c4ccccc4)c3)nc3ccccc32)cc1]

;

and the electron transport layer comprises an electron transport material having one of the following chemical formulas 1-1 to 1-8:

(1-1)
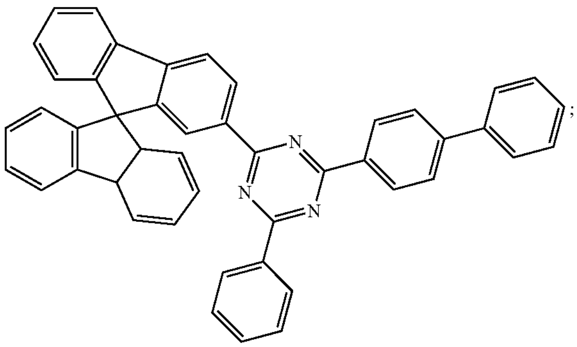
;
(1-2)
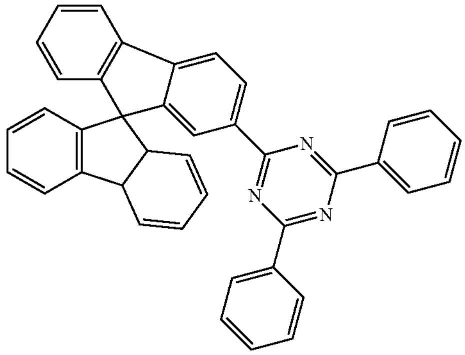
;
(1-3)
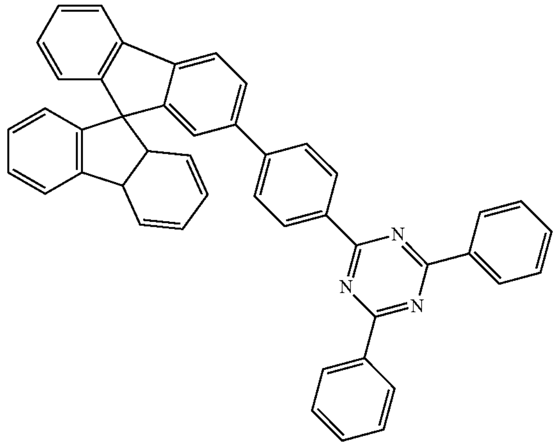
;
-continued
(1-4)
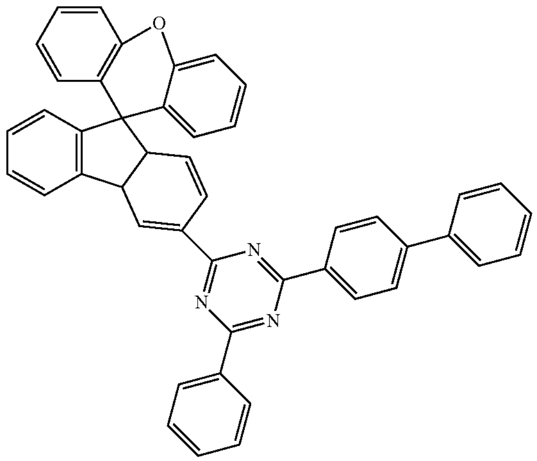
;
(1-5)
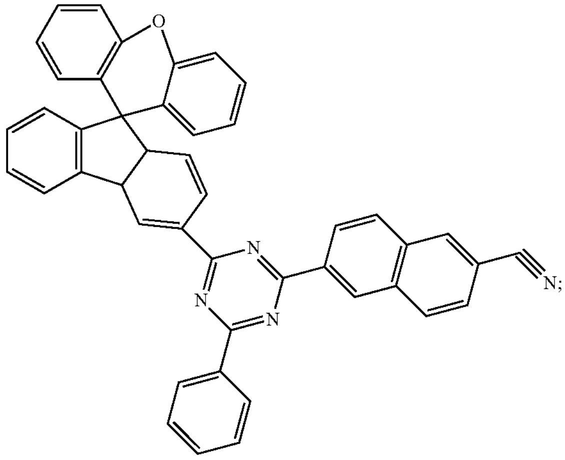
N;
(1-6)
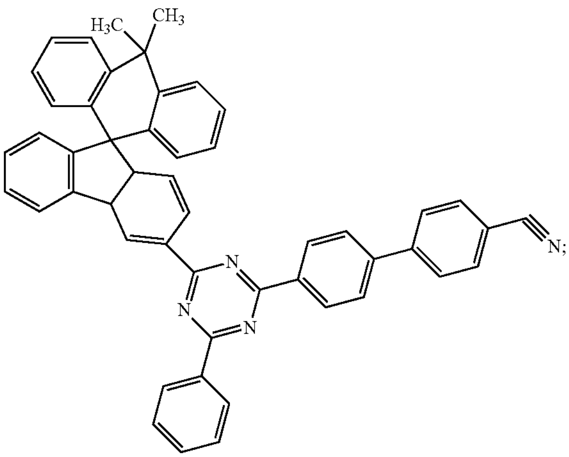
N;

-continued (1-7)

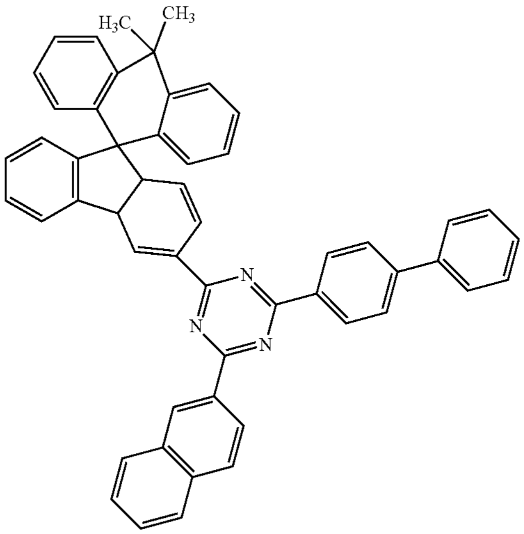

; and (1-8)

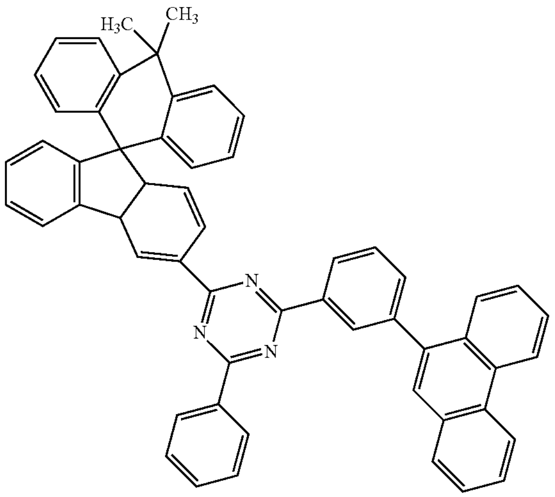

.

2. The organic light-emitting diode according to claim 1, wherein an energy level difference between a LUMO energy level of the electron transport layer and a LUMO energy level of the hole blocking layer is larger than or equal to 0.2 eV.

3. The organic light-emitting diode according to claim 2, wherein the LUMO energy of the hole blocking layer is less than a LUMO energy level of the blue luminescent host material.

4. The organic light-emitting diode according to claim 1, further comprising a hole injection layer, a hole transport layer, and an electron blocking layer, which are sequentially disposed between the first electrode and the light-emitting layer, and an electron injection layer between the electron transport layer and the second electrode.

5. The organic light-emitting diode according to claim 4, further comprising a light extraction layer on a side of the second electrode distal to the first electrode, wherein the hole injection layer comprises a material of p-type doping F4TCNQ which has the following formula:

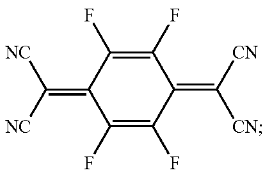 [SMILES: N#CC(C#N)=c1c(F)c(F)c(=C(C#N)C#N)c(F)c1F]

;

the hole transport layer comprises a material of m-MTDATA which has the following formula:

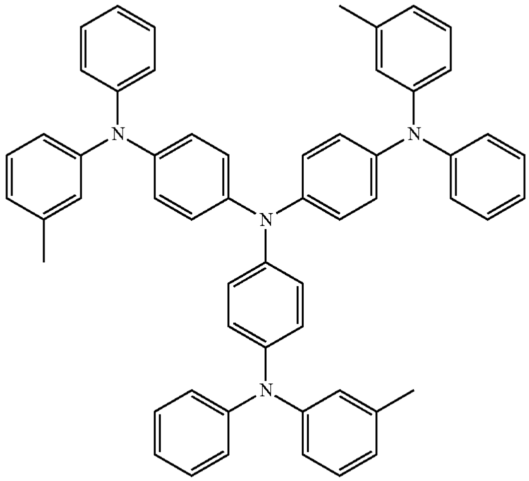

;

the electron blocking layer comprises a material of mCBP which has the following formula:

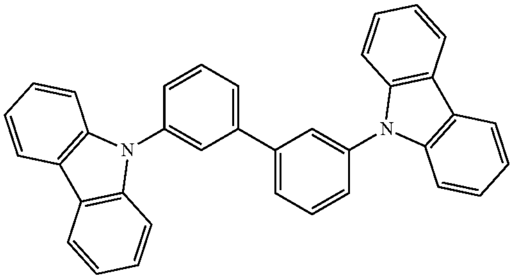

;

the light extraction layer comprises a light extraction material having one of the following chemical formulas 2-1 to 2-6:

(2-1)
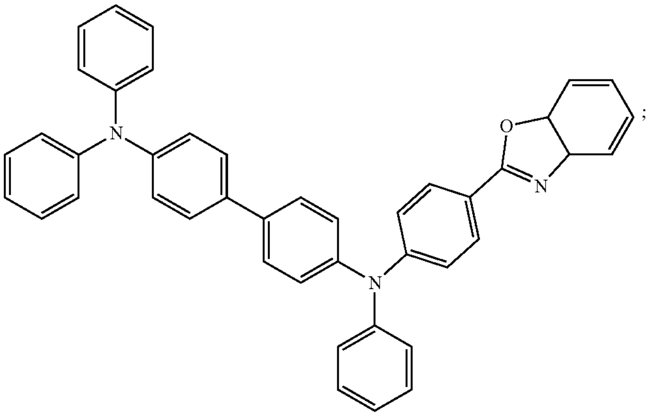
;
(2-2)
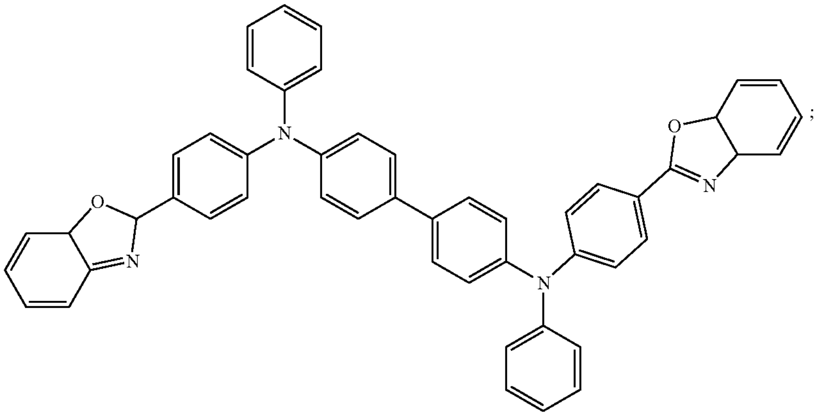
;
(2-3)
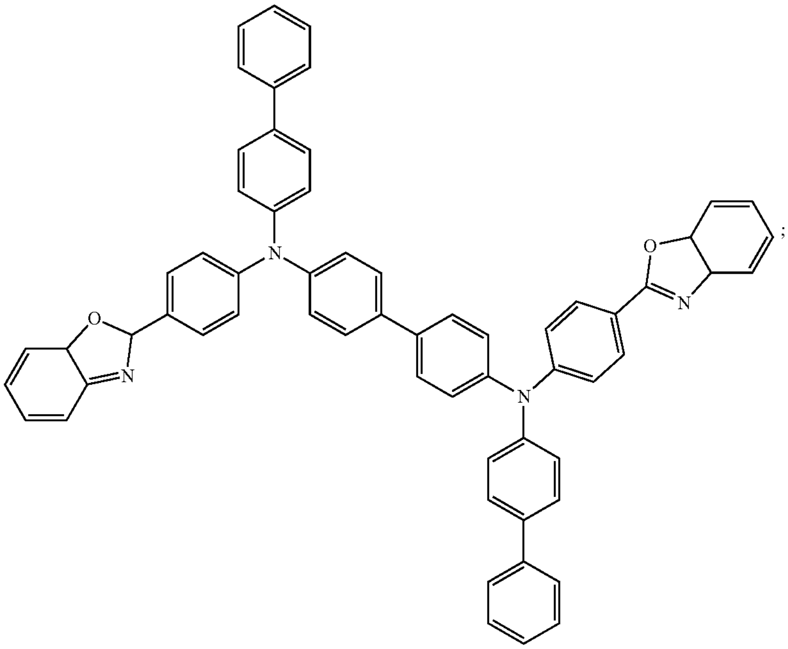
;

-continued
(2-4)
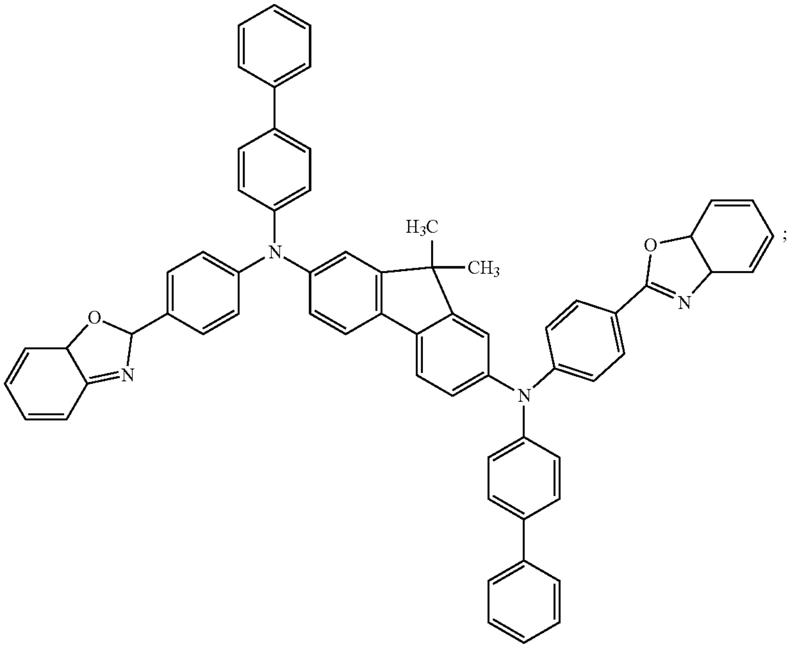
;
(2-5)
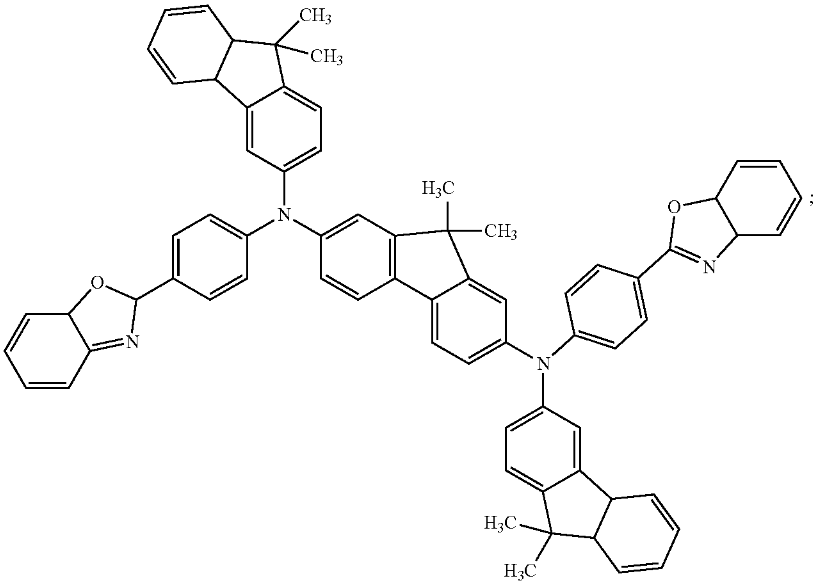
; and

-continued (2-6)

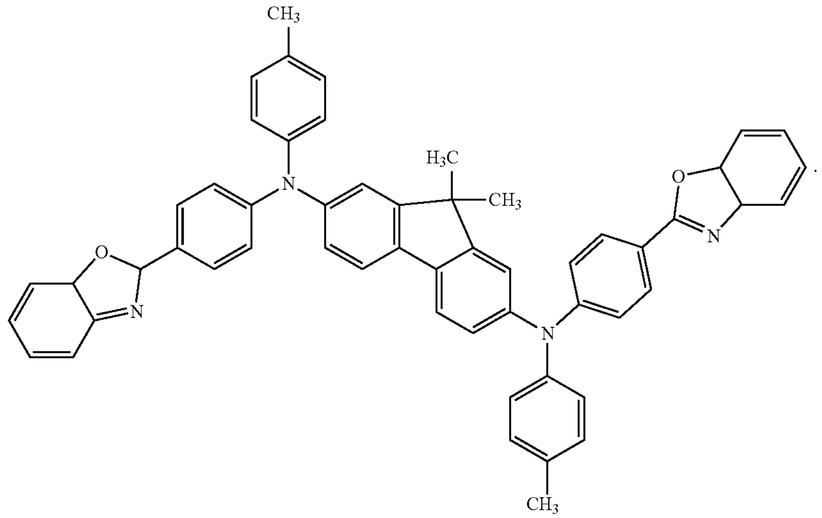

6. A display panel, comprising the organic light-emitting diode according to claim 1.

7. The organic light-emitting diode according to claim 1, further comprising a light extraction layer on a side of the second electrode distal to the first electrode, wherein the light extraction layer comprises a light extraction material having a following formula:

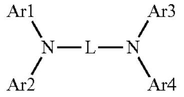

where L is selected from one of a single bond, a substituted or un-substituted arylene group having 6 to 18 carbon atoms, and a substituted or un-substituted heteroarylene group having 3 to 18 carbon atoms; and Ar1, Ar2, Ar3 and Ar4 are independently selected from one of a substituted or un-substituted aryl group having 6 to 60 carbon atoms and a substituted or un-substituted heteroaryl group having 2 to 60 carbon atoms.

8. The organic light-emitting diode according to claim 7, wherein at least one of Ar1, Ar2, Ar3 and Ar4 is selected from a following group:

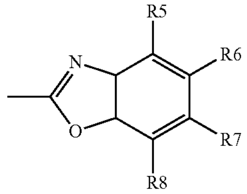

where R5, R6, R7 and R8 are selected from one of a substituted or un-substituted alkyl group having 1 to 30 carbon atoms and a substituted or un-substituted aryl group having 6 to 30 carbon atoms.

9. The organic light-emitting diode according to claim 8, wherein at least one pair of adjacent groups among R5, R6, R7, R8 are linked to form a ring.

10. The organic light-emitting diode according to claim 7, wherein the light extraction layer comprises a light extraction material having one of the following chemical formulas 2-1 to 2-6:

(2-1)

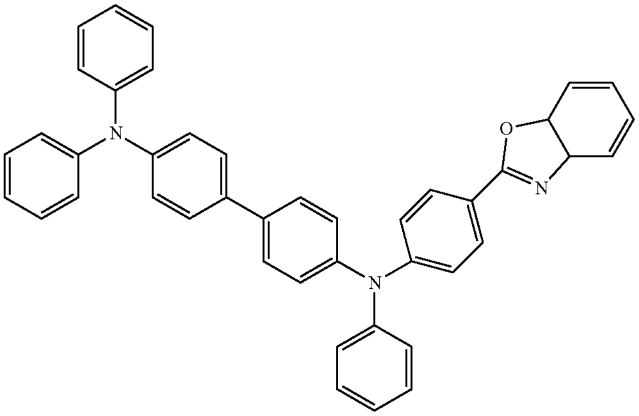

;

-continued
(2-2)
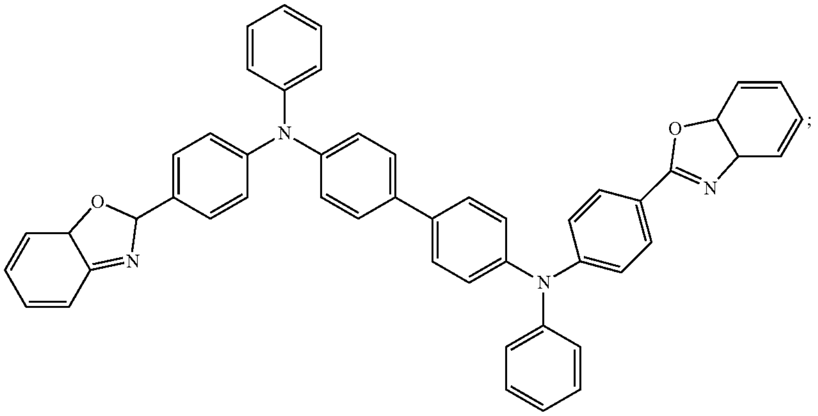
(2-3)
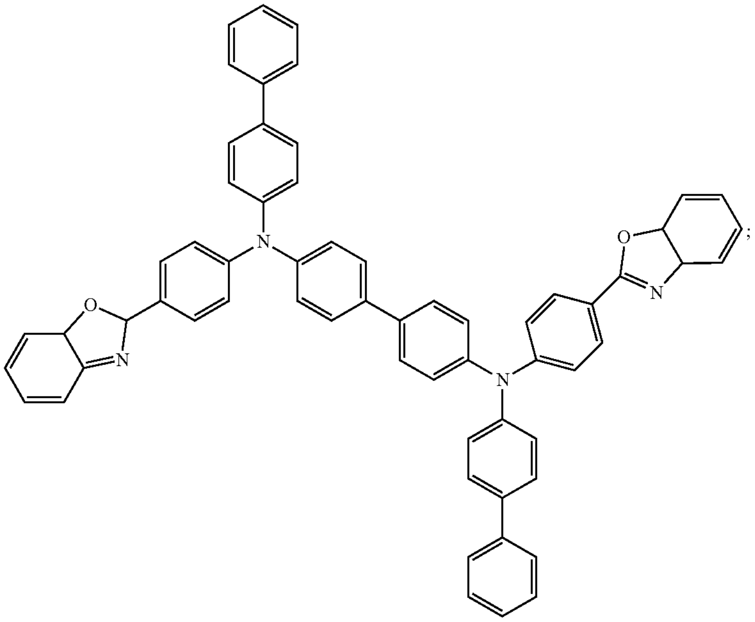
(2-4)
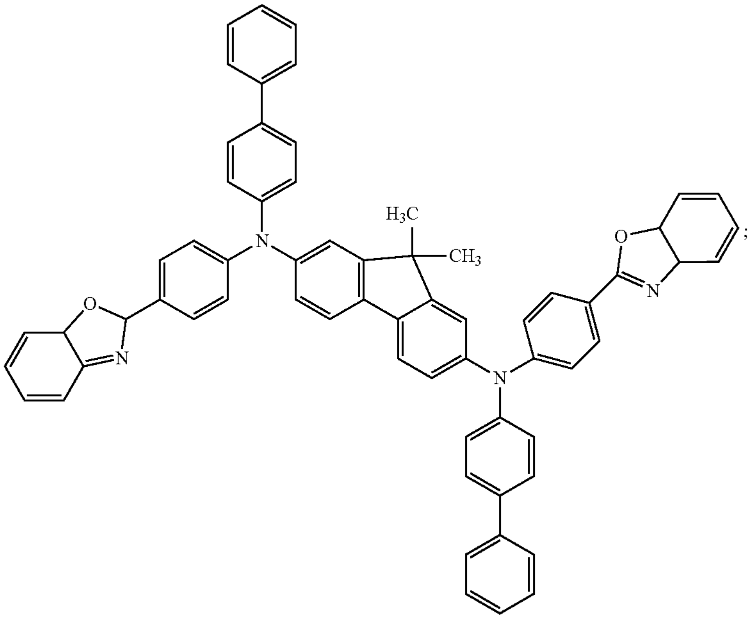

-continued
(2-5)
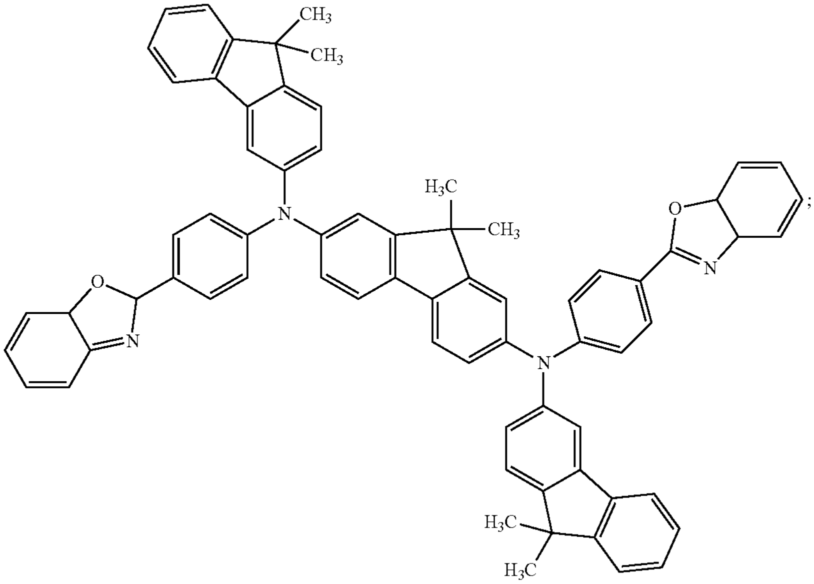
; and
(2-6)
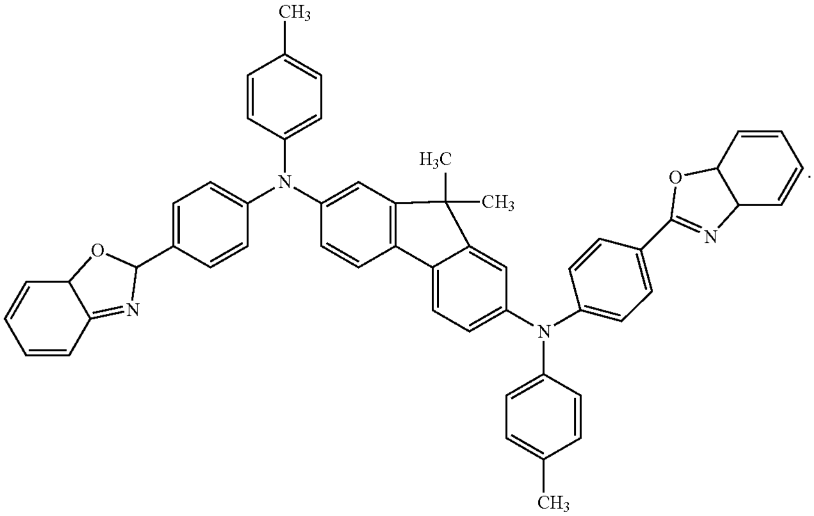
.
* * * * *